US010784664B2

(12) United States Patent
Mahoney et al.

(10) Patent No.: US 10,784,664 B2
(45) Date of Patent: Sep. 22, 2020

(54) THREE-PIECE ELECTRONICS ENCLOSURE (71) Applicant: Cisco Technology, Inc., San Jose, CA (US)

(72) Inventors: William George Mahoney, Suwanee, GA (US); John Alexander Ritchie, Jr., Duluth, GA (US)

(73) Assignee: Cisco Technology, Inc., San Jose, CA (US)

( * ) Notice: Subject to any disclaimer, the term of this patent is extended or adjusted under 35 U.S.C. 154(b) by 381 days.

(21) Appl. No.: 15/911,382

(22) Filed: Mar. 5, 2018

(65) Prior Publication Data
US 2019/0273369 A1    Sep. 5, 2019

(51) Int. Cl.
| H02G 3/03 | (2006.01) |
| H05K 5/02 | (2006.01) |
| H02G 3/08 | (2006.01) |
| H05K 7/20 | (2006.01) |
| H04B 1/16 | (2006.01) |
| H04B 1/04 | (2006.01) |
| H02G 3/14 | (2006.01) |

(52) U.S. Cl.
CPC .............. *H02G 3/03* (2013.01); *H02G 3/083* (2013.01); *H02G 3/14* (2013.01); *H05K 5/02* (2013.01); *H02G 3/086* (2013.01); *H02G 3/088* (2013.01); *H04B 1/04* (2013.01); *H04B 1/16* (2013.01); *H05K 7/20409* (2013.01); *H05K 7/20418* (2013.01)

(58) Field of Classification Search
CPC ......... H05K 7/2039–2049; H05K 5/02; H02G 3/083; H02G 3/03; H02G 3/14; H02G 3/086; H02G 3/088; H04B 1/04; H04B 1/16
See application file for complete search history.

(56) References Cited

U.S. PATENT DOCUMENTS

| 5,058,198 A | * | 10/1991 | Rocci ..................... H03H 7/482 333/100 |
| 5,267,122 A | * | 11/1993 | Glover ................. G02B 6/3897 174/50.51 |
| 5,641,953 A | * | 6/1997 | Fisher, Jr. .............. H01H 9/104 200/50.12 |
| 5,648,745 A | * | 7/1997 | Spriester .............. H01R 9/0509 333/100 |
| 5,756,935 A | * | 5/1998 | Balanovsky ........... H01R 24/46 174/549 |

(Continued)

*Primary Examiner* — Zachary Pape
(74) *Attorney, Agent, or Firm* — Merchant & Gould P. C.

(57) ABSTRACT

A three-piece electronics enclosure may be provided. The electronics enclosure may comprise a back housing, a lid, and a center frame. The back housing may comprise back housing heat sinks on an exterior of the back housing and back housing circuitry disposed in an interior of the back housing. The lid may comprise lid heat sinks on an exterior of the lid and lid circuitry disposed in an interior of the lid. The center frame may be disposed between the back housing and the lid. The center frame may comprise a plurality of input/output (I/O) ports comprising a first I/O port and a second I/O port. At least one of the plurality of I/O ports may provide power to the back housing circuitry and the lid circuitry. The center frame may further comprise a power bypass that passes power between the first I/O port and the second I/O port.

20 Claims, 7 Drawing Sheets

(56) References Cited

U.S. PATENT DOCUMENTS

| | | | | |
|---|---|---|---|---|
| 5,814,905 | A * | 9/1998 | Tang | H01R 9/0509 |
| | | | | 307/119 |
| 6,133,939 | A * | 10/2000 | Gresko | H04N 7/104 |
| | | | | 725/127 |
| 6,580,336 | B1 * | 6/2003 | Gerszberg | H01R 13/7031 |
| | | | | 333/100 |
| 7,518,863 | B2 * | 4/2009 | Wayman | H05K 7/186 |
| | | | | 165/185 |
| 9,853,731 | B2 * | 12/2017 | Maricevic | H04B 10/25751 |
| 2019/0273331 | A1 * | 9/2019 | Mahoney | H01R 9/05 |

* cited by examiner

THREE-PIECE ELECTRONICS ENCLOSURE

TECHNICAL FIELD

The present disclosure relates generally to electronics enclosures.

BACKGROUND

A Hybrid Fiber-Coaxial (HFC) network is a broadband network that combines optical fiber and coaxial cable. It has been commonly employed globally by cable television operators. In a hybrid fiber-coaxial cable network, television channels are sent from a cable system's distribution facility (e.g., a headend) to local communities through optical fiber trunk lines. At the local community, a box translates the signal from a light beam to electrical signal, and sends it over cable lines for distribution to subscriber residences. The optical fiber trunk lines provide adequate bandwidth to allow future expansion and new bandwidth-intensive services.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

A three-piece electronics enclosure may be provided. The electronics enclosure may comprise a back housing, a lid, and a center frame. The back housing may comprise back housing heat sinks on an exterior of the back housing and back housing circuitry disposed in an interior of the back housing. The lid may comprise lid heat sinks on an exterior of the lid and lid circuitry disposed in an interior of the lid. The center frame may be disposed between the back housing and the lid. The center frame may comprise a plurality of input/output (I/O) ports comprising a first I/O port and a second I/O port. At least one of the plurality of I/O ports may provide power to the back housing circuitry and the lid circuitry. The center frame may further comprise a power bypass that passes power between the first I/O port and the second I/O port.

Both the foregoing overview and the following example embodiments are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

In an HFC network, a node may comprise a container that may house optical and electrical circuitry. An optical fiber cable may be connected to one side of the node and a plurality of coaxial cables may be connected to the other side of the node. The optical fiber cable may be connected to a headend in the HFC network and the plurality of coaxial cables may be connected to Customer Premises Equipment (CPE) of subscribers to the HFC. As such, the node may facilitate communications between the headend and the CPE.

Many electronic designs may be challenged with the task of heat dissipation. This may be particularly difficult with outdoor HFC cable enclosures (e.g., nodes) because they may be hermetically sealed and may not use forced convection. Instead, natural convection through the use of finned die casted enclosures may be used. These outdoor enclosures may also use removable internal modules for electronics to make repairs easier as the enclosures themselves may be connected to a network with hardline coaxial cables, power, and fiber for example.

Removing the enclosure may require the hardline to be cut so the enclosure can be removed thus interrupting end user service. This may be time consuming and costly. Removable internal modules, however, may greatly speeds up repairs by reducing service interruption. To increase heat dissipation, surface area may be increased and thermal resistances may be reduced with removable internal modules. As newer electronics and technologies are used, greater power and heat dissipation capability may be needed.

To address these problems, embodiments of the disclosure may split a conventional sealed two-piece housing into a three-piece sealed structure. For example, a center frame may be sandwiched between a lid and a back housing. The advantage of this may be that input/output (I/O) hard line Radio Frequency (RF) and fiber connections from the network may be connected to the center frame. Consequently, the center frame may stay in place in the network during repairs without needing to cut the hardline cables or remove the fiber stub.

Furthermore, the lid and back housing may include any circuitry (e.g., from a node to a line amplifier). For a Full Duplex (FDX) node for example, the back housing may mount a main Launch Amplifier Printed Circuit Board Assembly (PCBA) directly to a finned mounting surface with embodiments of the disclosure. Thus, a thermal interface resistance created by the conventional amplifier modules may be eliminated. Accordingly, the conductive heat dissipation path may be reduced and heat dissipation efficiency may be improved. Similarly, regarding the lid, heat producing components may be directly mounted to a finned mounting surface in the lid to improve heat conduction and dissipation in the lid.

Moreover, the center frame may be used for adding a power (e.g., Alternating Current (AC) power) bypass feature. Accordingly, power to down-line nodes may not be interrupted when the current node is down for repairs. In addition, the center frame may include a cable tray and provide additional space for fiber and cable management. Furthermore, weather/Electromagnetic Interference (EMI) gaskets may be mounted to the lid and the back housing. Consequently, when either is replaced, a new weather/EMI gasket may be installed.

Figure 1:
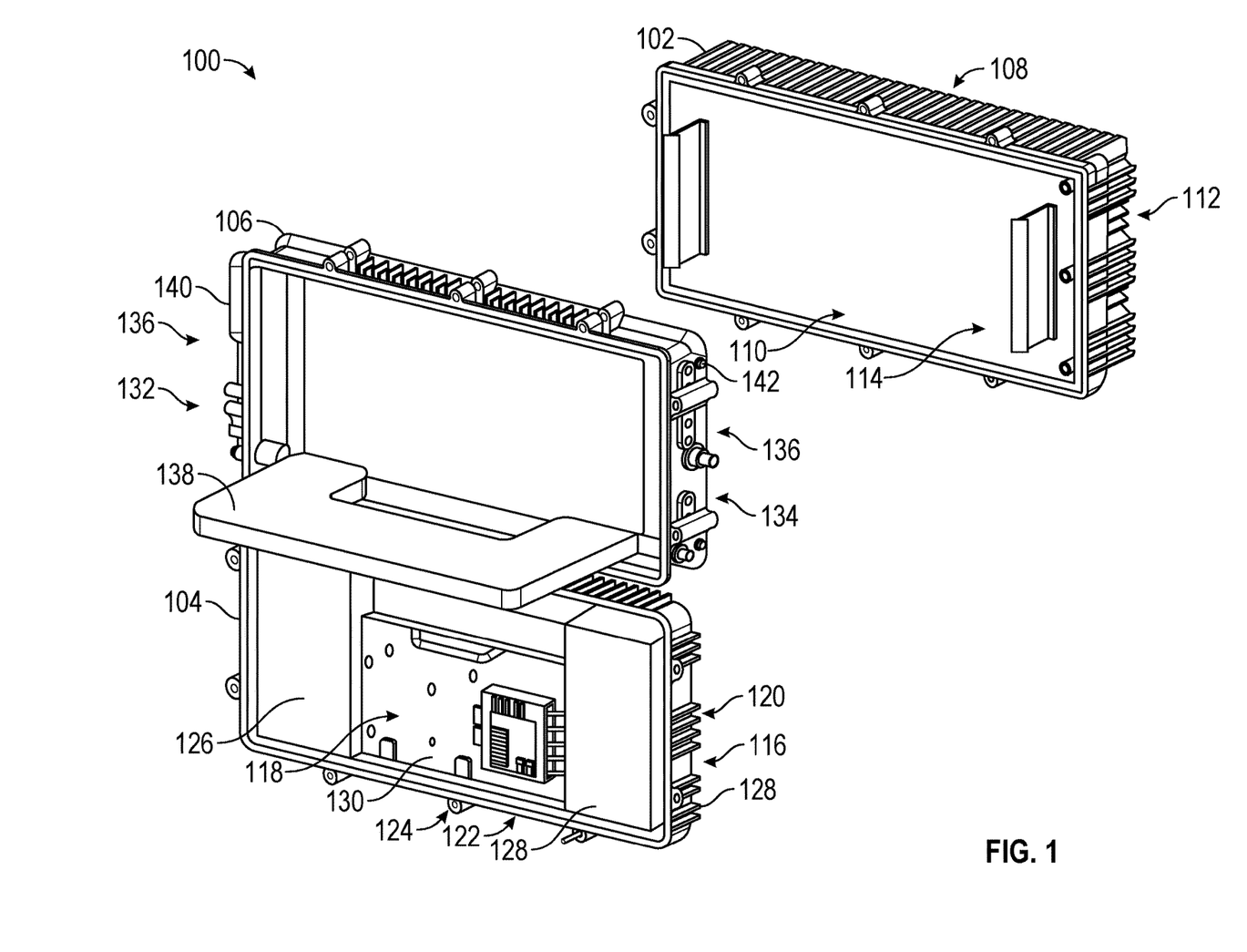
FIG. 1 shows a three-piece electronics enclosure.

FIG. 1 shows a three-piece electronics enclosure 100 consistent with embodiments of the disclosure. Three-piece electronics enclosure 100 may comprise, but is not limited to, a node on an HFC network. As shown in FIG. 1, three-piece electronics enclosure 100 may include a back housing 102, a lid 104, and a center frame 106. Back housing 102 may comprise an exterior of the back housing 108, an interior of the back housing 110, back housing heat sinks 112, and a back housing circuitry 114. Back housing circuitry 114 may comprise, but is not limited to, a launch amplifier.

Back housing circuitry 114 may be mounted directly to an interior surface of interior of the back housing 110. In this way a direct conductive heat dissipation path may be created from back housing circuitry 114 to back housing heat sinks 112 and heat may be dissipated directly from back housing circuitry 114 to back housing heat sinks 112.

Lid 104 may comprise an exterior of the lid 116, an interior of the lid 118, lid heat sinks 120, and lid circuitry 122. Lid circuitry 122 may comprise a plurality of lid circuitry components 124. Lid circuitry components 124 may comprise, but are not limited to, a first power supply 126, a second power supply 128, a remote physical layer (R-Phy) circuit 130, a transmitter, a receiver, and an optical interface board. The optical interface board may comprise, but is not limited to, an analog receiver, R-Phy circuit 130, and a control unit.

Some or all of plurality of lid circuitry components 124 may be mounted directly to an interior surface of interior of the lid 118. In this way a direct conductive heat dissipation path may be created from some or all of plurality of lid circuitry components 124 to lid heat sinks 120 and heat may be dissipated directly from some or all of plurality of lid circuitry components 124 to lid heat sinks 120.

Center frame 106 may comprise a center frame first side 132, a center frame second side 134, a plurality of input/output (I/O) ports 136, and a fiber tray 138. Plurality of I/O ports 136 may comprise a first I/O port 140 and a second I/O port 142. Fiber tray 138 may be hingably connected within center frame 106. As shown in FIG. 1, fiber tray 138 may rotate out to at least a horizontal position when lid 104 is open and may rotate to a vertical position in center frame 106 when lid 104 is closed.

Figure 2:
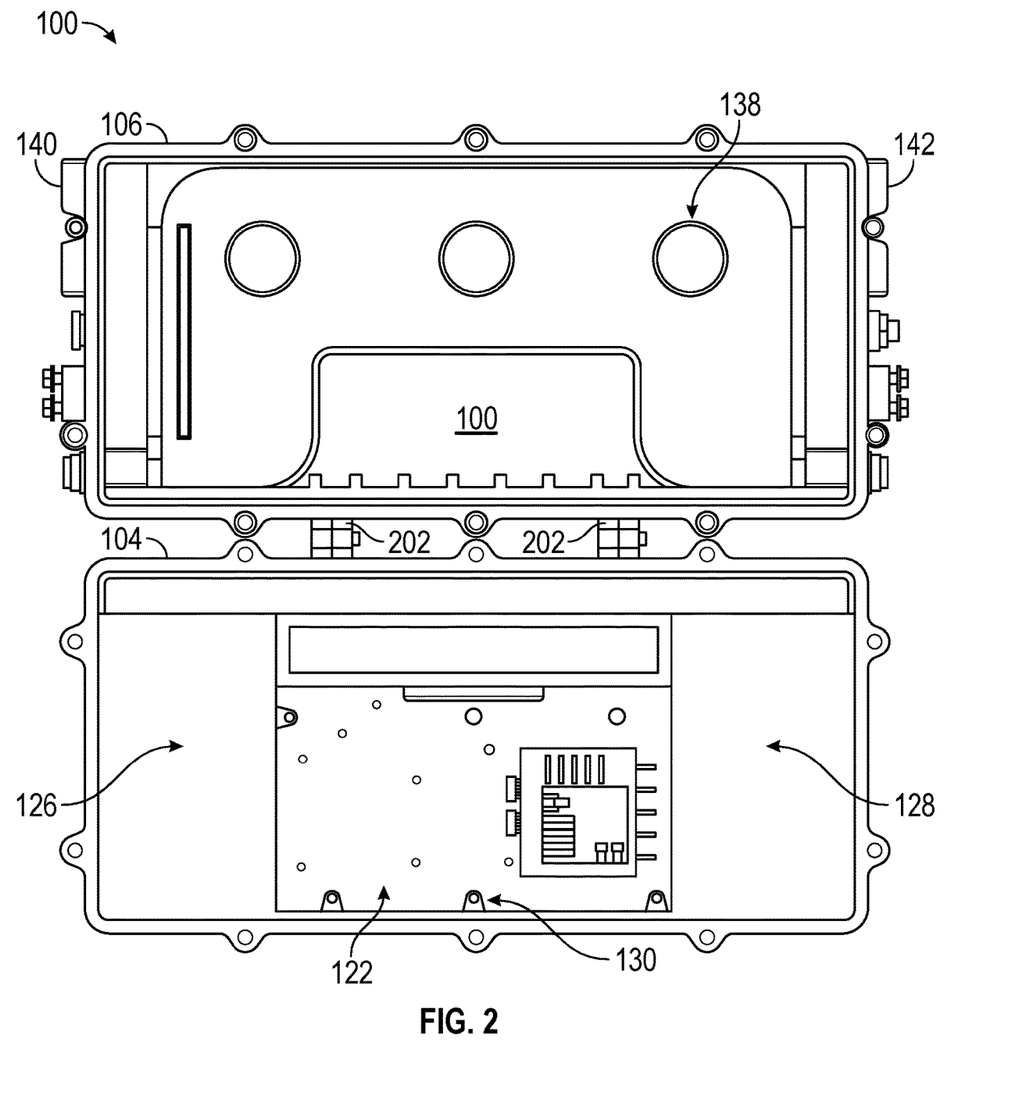
FIG. 2 shows a three-piece electronics enclosure.
Figure 3:
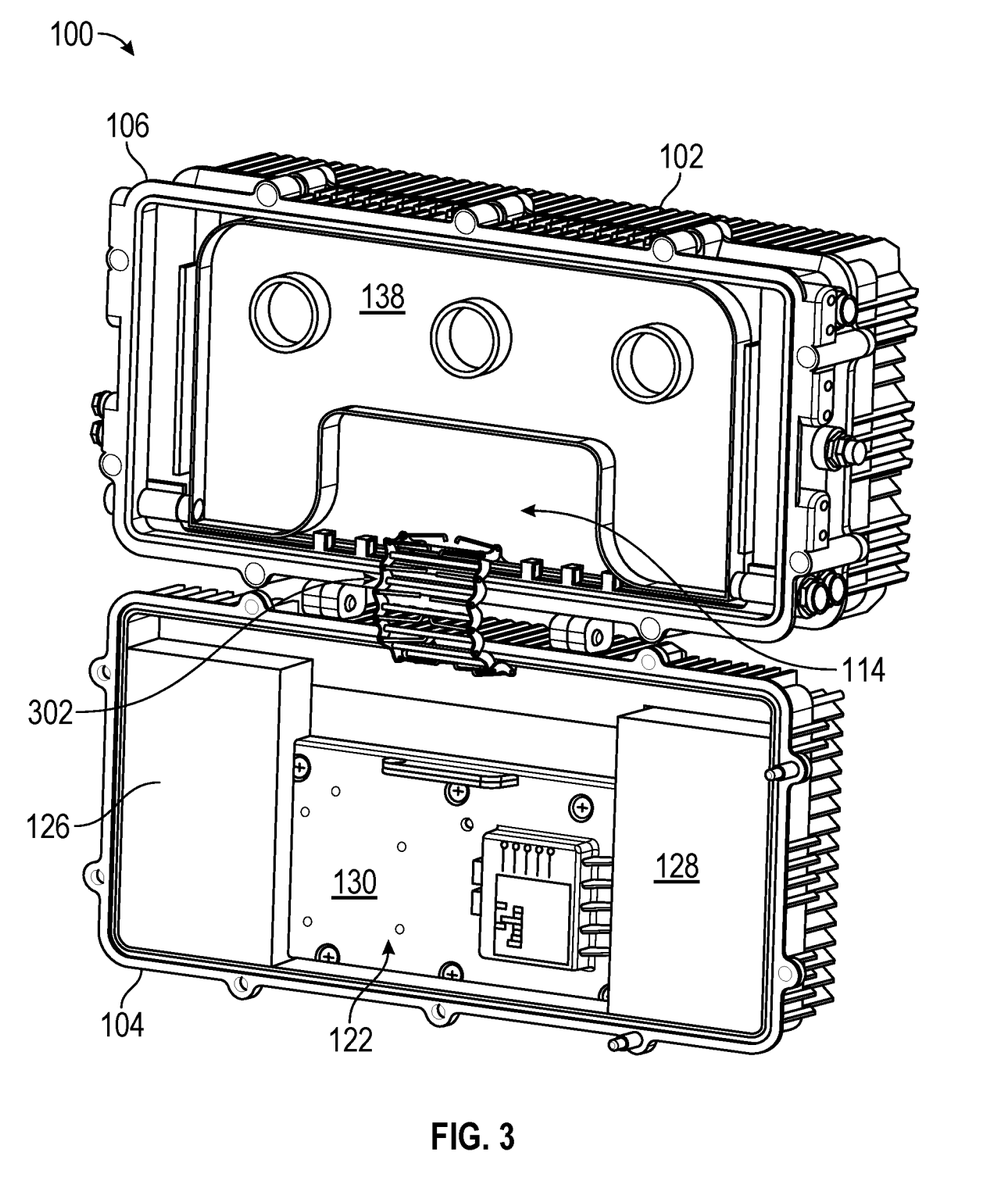
FIG. 3 shows a three-piece electronics enclosure.

FIG. 2 shows three-piece electronics enclosure 100 consistent with embodiments of the disclosure where lid 104 may be hingably connected to center frame 106 via a hinge 202. As shown in FIG. 2, center frame 106 may correspondingly mate with back housing 102 and fiber tray 138 may rotate to a vertical position within center frame 106. FIG. 3 shows three-piece electronics enclosure 100 consistent with embodiments of the disclosure where back housing circuitry 114 may be connected to lid circuitry 122 via a compact I-Node cable track 302.

Figure 4:
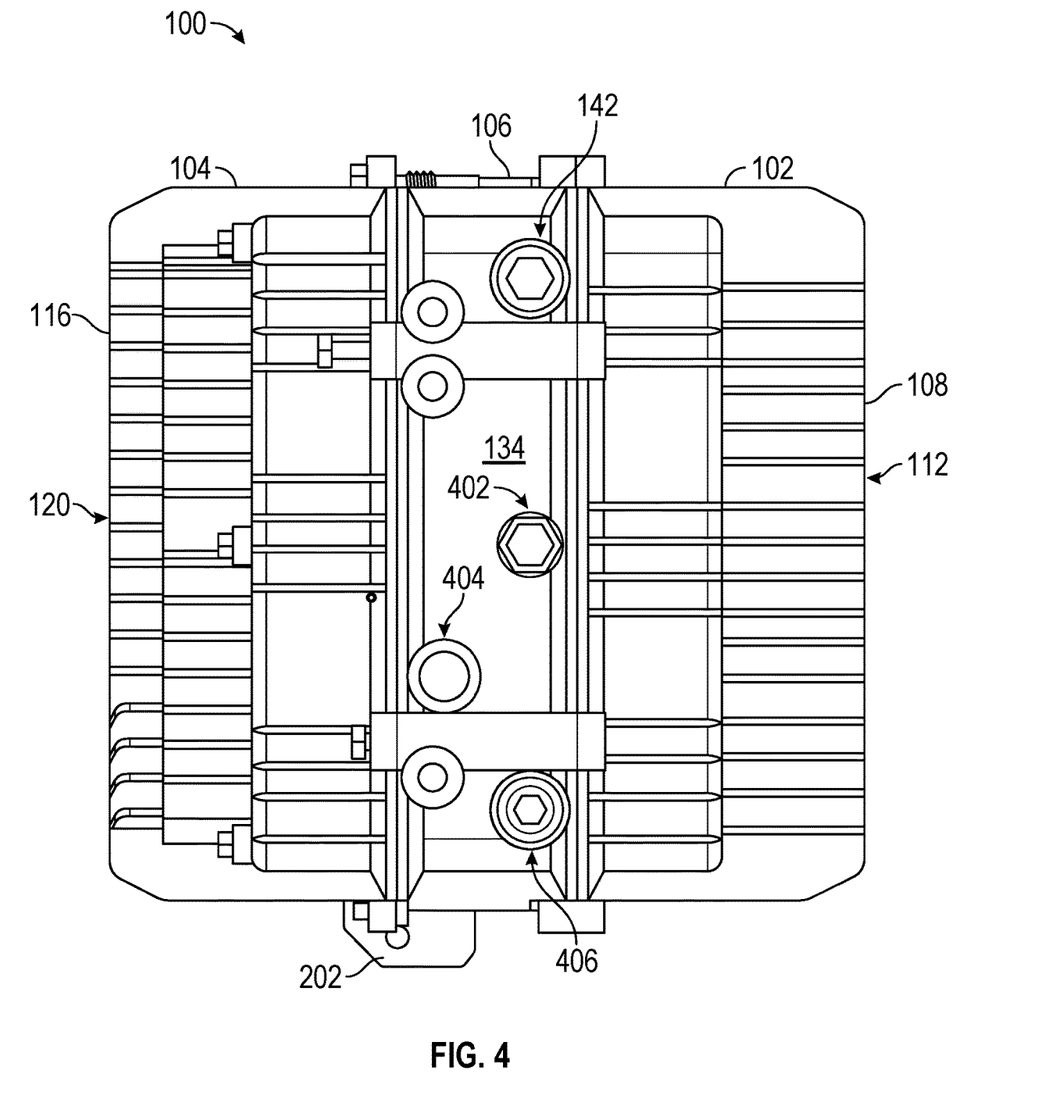
FIG. 4 shows a side view of a three-piece electronics enclosure.

FIG. 4 shows a side view of three-piece electronics enclosure 100. As shown in FIG. 4, lid 104 may swing on hinge 202 and correspondingly mate with center frame 106. A first weather/Electromagnetic Interference (EMI) gasket may be placed between lid 104 and center frame 106. A second weather/EMI gasket may be placed between back housing 102 and center frame 106. Through bolts may pass from lid 104, through center frame 106, and attach to back housing 102. By fastening the through bolts with benefit of the weather/EMI gaskets, three-piece electronics enclosure 100 may be hermetically sealed.

As shown in FIG. 4, plurality of I/O ports 136 may further include a power port 402, a fiber port 404, and a third I/O port 406. Similarly, center frame first side 132 may also include a power port, fiber ports, and additional I/O ports. Plurality of I/O ports 136 may comprise coaxial ports that may send and receive Radio Frequency (RF) signals to and from three-piece electronics enclosure 100 that may be processed by back housing circuitry 114 and lid circuitry 122. Similarly, fiber ports (e.g., fiber port 404) may send and receive optical signals to and from three-piece electronics enclosure 100 that may be processed by back housing circuitry 114 and lid circuitry 122. Power ports (e.g., power port 402) receive and transmit electrical energy.

Figure 5:
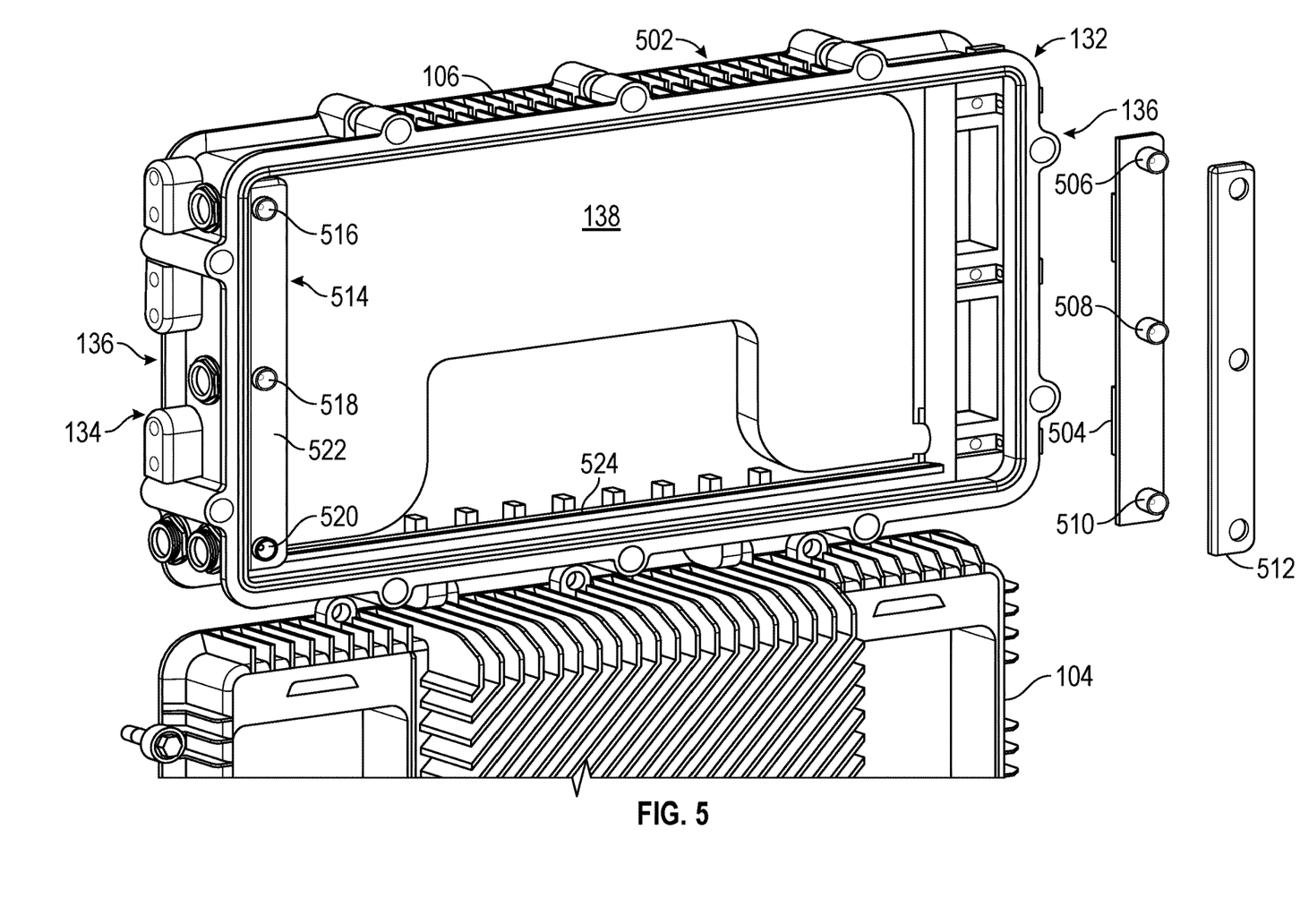
FIG. 5 shows a power bypass.

FIG. 5 shows a power bypass 502 that may be used in conjunction with three-piece electronics enclosure 100 consistent with embodiments of the disclosure. As shown in FIG. 5, power bypass 502 may comprise a center frame first side power bypass circuit 504, a center frame first side power bypass circuit cover 512, a center frame second side power bypass circuit 514, a center frame second side power bypass circuit cover 522, and a power bypass conductor tray 524.

Center frame first side power bypass circuit 504 may comprise a plurality of first side power bypass circuit receptacles that may include, but are not limited to, a first side power bypass circuit first receptacle 506, a first side power bypass circuit second receptacle 508, and a first side power bypass circuit third receptacle 510. Center frame second side power bypass circuit 514 may comprise a plurality of second side power bypass circuit receptacles that may include, but are not limited to, a second side power bypass circuit first receptacle 516, a second side power bypass circuit second receptacle 518, and a second side power bypass circuit third receptacle 520. Power bypass conductor tray 524 may include a power bypass conductor that may conduct electric power between center frame first side power bypass circuit 504 and center frame second side power bypass circuit 514.

In addition to sending and receiving RF signals to and from three-piece electronics enclosure 100, hardline coaxial cables may also send and receive electrical energy to power back housing circuitry 114, lid circuitry 122, and other HFC nodes up and down the line. Consistent with embodiments of the disclosure, hardline coaxial cables may be connected to plurality of I/O ports 136. Those hardline coaxial cables connected to plurality of I/O ports 136 on center frame first side 132 may, in turn be connected to center frame first side power bypass circuit 504. Similarly, those hardline coaxial cables connected to plurality of I/O ports 136 on center frame second side 134 may, in turn be connected to center frame second side power bypass circuit 514. These hardline coaxial cables may be connected to and may feed power to other HFC nodes up and down the line.

Consistent with embodiments of the disclosure, a power bypass conductor in power bypass conductor tray 524 may electrically connect center frame first side power bypass circuit 504 and center frame second side power bypass circuit 514 and pass electrically energy between those hardline coaxial cables connected to plurality of I/O ports 136 on center frame first side 132 and those hardline coaxial cables connected to plurality of I/O ports 136 on center frame second side 134. Consequently, because electrical energy may be passed by power bypass 502 between those hardline coaxial cables connected to plurality of I/O ports 136 on center frame first side 132 and those hardline coaxial cables connected to plurality of I/O ports 136 on center frame second side 134, center frame 106 may stay in place in the network during repairs to three-piece electronics enclosure 100 without needing to cut the hardline cables or remove the fiber stub. In this way, power may not be disturbed to other HFC nodes up and down the line that may be connected to three-piece electronics enclosure 100.

Figure 6:
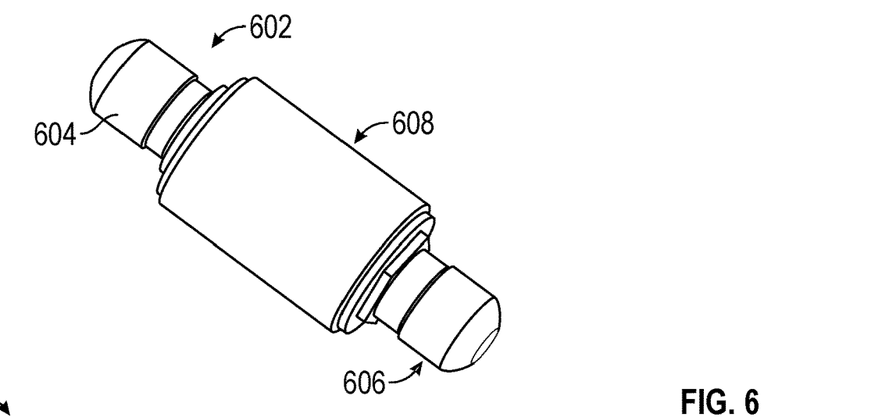
FIG. 6 shows a connector.

FIG. 6 shows a connector 602. Connector 602 may comprise a connector first end 604, a connector second end 606, and a connector middle section 608. A plurality of connectors 602 may be used where first ends 604 may be disposed in the plurality of first side power bypass circuit receptacles and in the plurality of second side power bypass circuit receptacles. When center frame 106 is mated with back housing 102, corresponding second ends 606 may connect to receptacles in back housing 102 in order to provide electrical energy and RF signals between the aforementioned hardline coaxial cables and back housing circuitry 114. In turn, electrical energy and the RF signals may be provided between back housing circuitry 114 and lid circuitry 122 via compact I-Node cable track 302. Middle section 608 may provide flexibility in making connections when center frame 106 is mated with back housing 102.

Figure 7:
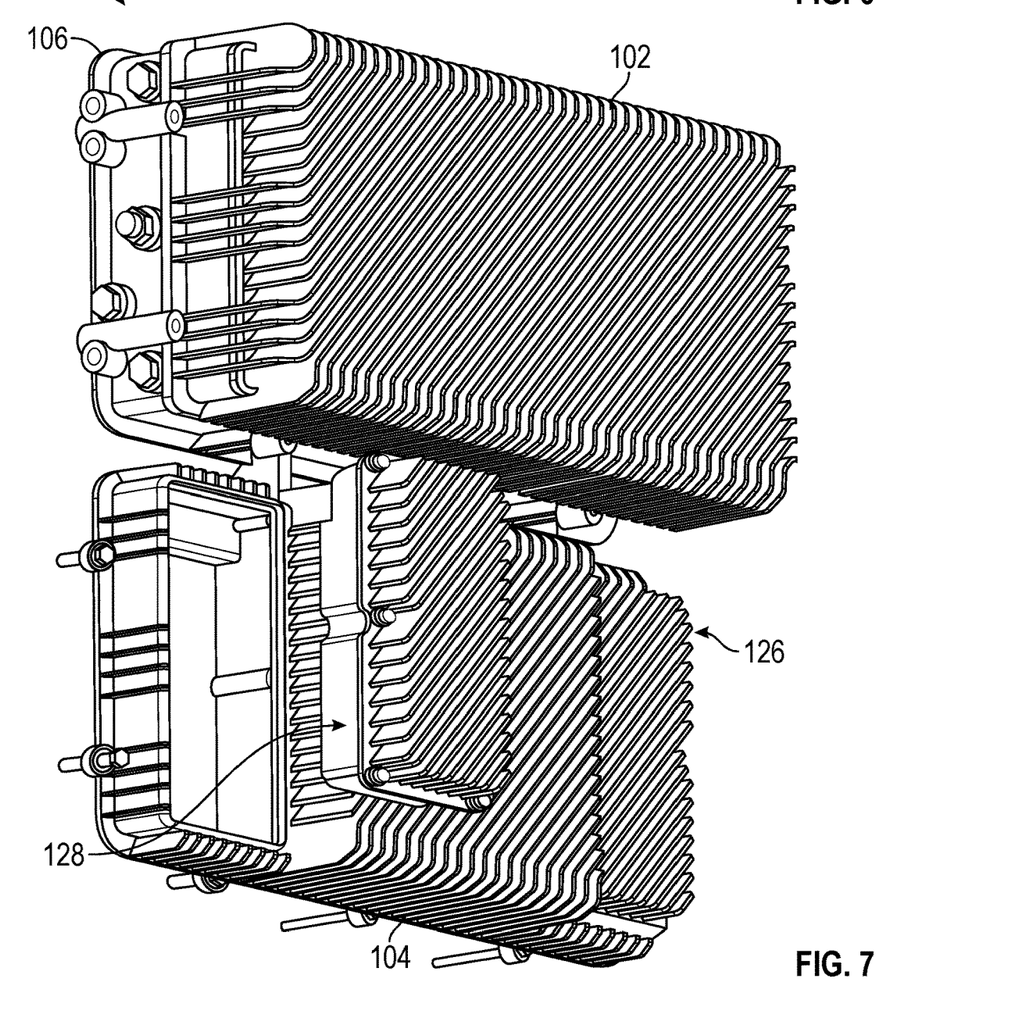
FIG. 7 shows a three-piece electronics enclosure.

FIG. 7 shows three-piece electronics enclosure 100. As shown in FIG. 7, ones of plurality of lid circuitry components 124 may be removed from or added to (e.g., plugged or unplugged) lid 104 without having to open three-piece electronics enclosure 100. For example, a defective second power supply 128 may be removed from lid 104 and a new second power supply 128 may be added in its place. In other words, lid circuitry 122 may comprise a plurality of lid circuitry components wherein at least one of the plurality of lid circuitry components may removable from exterior of the lid 118.

Figure 8:
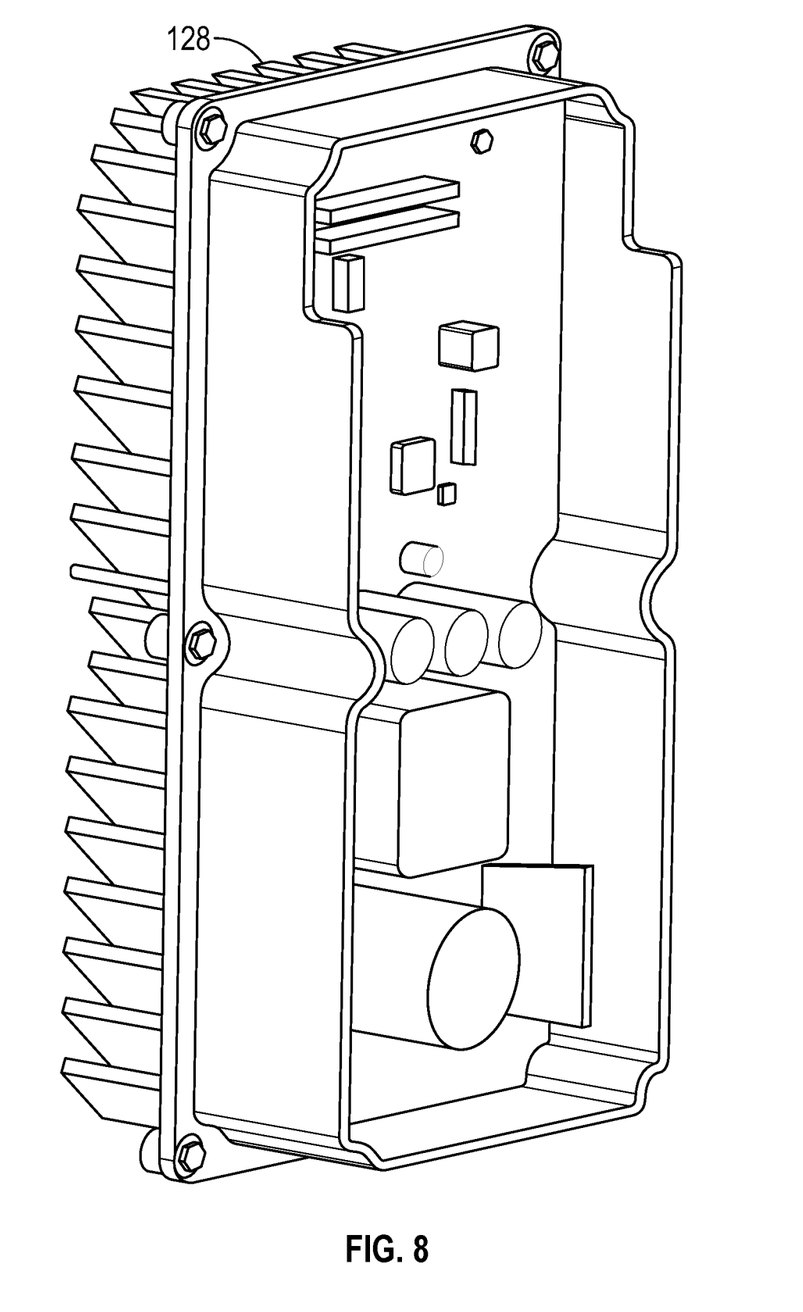
FIG. 8 shows a power supply.

FIG. 8 shows second power supply 128 from FIG. 7. As shown in FIG. 8, second power supply 128 may be mounted directly to a removable portion of interior surface of interior of the lid 118. In this way, a direct conductive heat dissipation path may be created from second power supply 128 to lid heat sinks 120 and heat may be dissipated directly from second power supply 128 to lid heat sinks 120.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus comprising:
   a back housing comprising:
      back housing heat sinks on an exterior of the back housing, and
      back housing circuitry disposed in an interior of the back housing;
   a lid comprising:
      lid heat sinks on an exterior of the lid, and
      lid circuitry disposed in an interior of the lid; and
   a center frame disposed between the back housing and the lid, the center frame comprising,
      a plurality of input/output (I/O) ports comprising a first I/O port and a second I/O port wherein at least one of the plurality of I/O ports provides power to the back housing circuitry and the lid circuitry, and
      a power bypass that passes power between the first I/O port and the second I/O port.

2. The apparatus of claim 1, wherein the back housing circuitry comprises a launch amplifier.

3. The apparatus of claim 1, wherein the back housing circuitry is mounted directly to an interior surface of the back housing.

4. The apparatus of claim 1, wherein the lid is hingably connected to the center frame.

5. The apparatus of claim 1, wherein the lid circuitry comprises a plurality of lid circuitry components wherein at least one of the plurality of lid circuitry components is mounted directly to an interior surface of the lid.

6. The apparatus of claim 1, wherein the lid circuitry comprises a plurality of lid circuitry components wherein at least one of the plurality of lid circuitry components is removable from the exterior of the lid.

7. The apparatus of claim 1, wherein the lid circuitry comprises a plurality of lid circuitry components wherein at least one of the plurality of lid circuitry components comprises a power supply.

8. The apparatus of claim 1, wherein the lid circuitry comprises a plurality of lid circuitry components wherein at least one of the plurality of lid circuitry components comprises a remote physical layer (R-Phy) circuit.

9. The apparatus of claim 1, wherein the lid circuitry comprises a plurality of lid circuitry components wherein at least one of the plurality of lid circuitry components comprises a transmitter.

10. The apparatus of claim 1, wherein the lid circuitry comprises a plurality of lid circuitry components wherein at least one of the plurality of lid circuitry components comprises a receiver.

11. The apparatus of claim 1, wherein the back housing circuitry connects to lid circuitry via a compact I-Node cable track.

12. The apparatus of claim 1, wherein the center frame further comprises a fiber tray wherein the fiber tray is hingably connected within the center frame.

13. The apparatus of claim 1, wherein the first I/O port comprises a coaxial cable port and the second I/O port comprises a coaxial cable port.

14. The apparatus of claim 1, wherein the first I/O port is disposed on a first side of the center frame and the second I/O port is disposed on a second side of the center frame.

15. An apparatus comprising:
   a back housing;
   a lid; and
   a center frame disposed between the back housing and the lid, the center frame comprising,
      a plurality of input/output (I/O) ports comprising a first I/O port and a second I/O port wherein at least one of the plurality of I/O ports provides power to back housing circuitry and lid circuitry, and
      a power bypass that passes power between the first I/O port and the second I/O port.

16. The apparatus of claim 15, wherein the back housing circuitry is disposed in an interior of the back housing and comprises a launch amplifier mounted directly to an interior surface of the back housing.

17. The apparatus of claim 15, wherein the lid circuitry is disposed in an interior of the lid and comprises a plurality of lid circuitry components wherein at least one of the plurality of lid circuitry components comprises one of the following: a power supply; a remote physical layer (R-Phy) circuit; a transmitter; and a receiver.

18. An apparatus comprising:
a back housing comprising;
    back housing heat sinks on an exterior of the back housing, and
    back housing circuitry disposed in an interior of the back housing wherein the back housing circuitry is mounted directly to an interior surface of the back housing;
a lid comprising;
    lid heat sinks on an exterior of the lid, and
    lid circuitry disposed in an interior of the lid wherein the lid circuitry comprises a plurality of lid circuitry components wherein at least one of the plurality of lid circuitry components is mounted directly to an interior surface of the lid; and
a center frame disposed between the back housing and the lid, the center frame comprising,
    a plurality of input/output (I/O) ports comprising a first I/O port and a second I/O port wherein at least one of the plurality of I/O ports provides power to the back housing circuitry and the lid circuitry wherein the first I/O port comprises a coaxial cable port and the second I/O port comprises a coaxial cable port wherein the first I/O port is disposed on a first side of the center frame and the second I/O port is disposed on a second side of the center frame, and
    a power bypass that passes power between the first I/O port and the second I/O port.

19. The apparatus of claim 18, wherein the back housing circuitry comprises a launch amplifier.

20. The apparatus of claim 18, wherein at least one of the plurality of lid circuitry components comprises one of the following: a power supply; a remote physical layer (R-Phy) circuit; a transmitter; and a receiver.

* * * * *